United States Patent
Plymale, Jr. et al.

(10) Patent No.: US 7,221,223 B2
(45) Date of Patent: May 22, 2007

(54) METHODS AND APPARATUS OF MANAGING A POWER AMPLIFIER

(75) Inventors: Leroy A. Plymale, Jr., North Richland Hills, TX (US); Joseph L. Clark, Haltom City, TX (US); Henry H. Nguyen, Fort Worth, TX (US); John S. Ruppel, Keller, TX (US); Thomas L. Sears, Hurst, TX (US); Ronald Porco, Fort Worth, TX (US); Armando Vera Jimenez, Fort Worth, TX (US)

(73) Assignee: Motorola, Inc., Schaumburg, IL (US)

( * ) Notice: Subject to any disclaimer, the term of this patent is extended or adjusted under 35 U.S.C. 154(b) by 118 days.

(21) Appl. No.: 11/191,739

(22) Filed: Jul. 28, 2005

(65) Prior Publication Data

US 2007/0024357 A1    Feb. 1, 2007

(51) Int. Cl.
*H03F 1/00*    (2006.01)

(52) U.S. Cl. .................................. 330/151; 330/149
(58) Field of Classification Search ................ 330/151, 330/149, 51; 375/297; 455/114.3
See application file for complete search history.

(56) References Cited

U.S. PATENT DOCUMENTS

| | | | |
|---|---|---|---|
| 5,831,479 A * | 11/1998 | Leffel et al. | |
| 5,867,060 A * | 2/1999 | Burkett, Jr. et al. | |
| 6,734,732 B2 * | 5/2004 | Cavers | 330/149 |
| 6,756,844 B2 * | 6/2004 | Nanao et al. | 330/149 |
| 6,771,125 B2 * | 8/2004 | Bingham | 330/151 |

* cited by examiner

*Primary Examiner*—Henry Choe (57) ABSTRACT

In the present technique for power management of a power amplifier, it is first determined (314) whether a counter value corresponds at least in a predetermined way to a counter threshold, and if so, a current status of at least one amplifier bank from a plurality of amplifier banks in a power amplifier is switched (316).

20 Claims, 11 Drawing Sheets

METHODS AND APPARATUS OF MANAGING A POWER AMPLIFIER

REFERENCE TO RELATED APPLICATIONS

This application is related to a co-pending application entitled "METHODS AND APPARATUS OF MANAGING A POWER AMPLIFIER," filed on even date herewith, assigned to the assignee of the present application, and hereby incorporated by reference.

TECHNICAL FIELD

This invention relates generally to methods and an apparatus of managing a power amplifier.

BACKGROUND

It is well-known that cellular base station power amplifiers are most efficient when operating at their rated power. These power amplifiers are generally sized for the maximum power required at a cell site's busiest hour. In order to conserve power, components are typically included to place unneeded overhead resources to sleep in the power amplifier at the device-level architecture. These components are generally complementary to other planned efficiency improvements. Because most of these prior art components are not backward compatible with legacy equipment, they cannot offer energy savings until multiple modules are plugged into the frame.

One prior method proposes a sleep mode architecture that places amplifier modules in and out of service. This architecture, however, is not self-contained and requires the assistance of an external controller. As a result, granularity is not maximized. This proposed sleep mode architecture typically requires a great deal of coordination between the power amplifiers and a higher level controller to manage the switching in and out of parallel amplifier modules. Thus, it is not an efficient solution to conserve power.

BRIEF DESCRIPTION OF THE DRAWINGS

The above needs are at least partially met through provision of methods and an apparatus of managing a power amplifier described in the following detailed description, particularly when studied in conjunction with the drawings, wherein.

Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present invention. Also, common and well-understood elements that are useful or necessary in a commercially feasible embodiment are often not depicted in order to facilitate a less obstructed view of these various embodiments of the present invention.

DETAILED DESCRIPTION

Generally speaking, pursuant to these various embodiments, it is first determined whether a counter value corresponds at least in a predetermined way to a counter threshold, and if so, a current status of at least one amplifier bank from a plurality of amplifier banks in a power amplifier is switched.

According to one embodiment, if, however, the counter value does not correspond at least in the predetermined way to the counter threshold, the method is repeated after waiting for a predefined period of time. In an embodiment, prior to the determination of the counter value to the counter threshold, a power output of the power amplifier is assessed to provide a current power output, which is compared to determine whether it corresponds in a predetermined way to a power threshold. If not, the method is repeated after waiting for a predefined period of time.

In another embodiment, the counter value is incremented prior to the comparison of the counter value and the counter threshold and resetting the counter value when the counter value corresponds at least in the predetermined way to the counter threshold. According to one embodiment, prior to switching the current status of the at least one amplifier bank, an amplifier bank from the plurality of amplifier banks that has been unchanged for a longest period of time is assessed to the at least one amplifier bank. A total number of the plurality of amplifier banks having a predefined current status is assessed to provide an assessed total value, and a current state of the power amplifier is assessed based, at least in part, on the assessed total value. In one embodiment, an adjust gain and phase value is further assessed based on the current state and adjustment of a gain and phase value of the power amplifier is based, at least in part, on the adjust gain and phase value. In an embodiment, a predefined power threshold that is based on the current state is assessed, and a power threshold is changed based at least in part on the predefined power threshold.

According to various embodiments, a power output of a power amplifier having a plurality of amplifier banks is assessed to provide a current power output, which is used for a comparison to determine whether it corresponds at least in a first predetermined way to a power threshold. If so, it is determined whether an up-counter value corresponds at least in a second predetermined way to an up-count threshold for switching on at least one amplifier bank from the plurality of amplifier banks. Otherwise, it is determined whether a down-counter value corresponds at least in a third predetermined way to a down-count threshold for switching off at least one amplifier bank from the plurality of amplifier banks.

In one embodiment, the comparison of the current power output and the power threshold further comprises a comparison to determine whether the current power output corresponds at least in a fourth predetermined way to an up-power threshold for switching on the at least one amplifier bank from the plurality of amplifier banks and a comparison to determine whether the current power output corresponds at least in a fifth predetermined way to a down-power threshold for switching off the at least one amplifier bank from the plurality of amplifier banks.

According to an embodiment, the comparison of the up-counter value and the up-counter threshold for switching on the at least one amplifier bank further comprises an assessment of at least one amplifier bank that has been off for a longest period of time to provide at least one assessed amplifier bank, which is selected for switching on. For the comparison of the down-counter value and the down-count threshold for switching off the amplifier bank similarly, at least one amplifier bank from the plurality of amplifier banks that has been on for a longest period of time is assessed to provide at least one assessed amplifier, which is selected for switching off. In one embodiment, a total number of amplifier banks that are on is assessed to provide an assessed on-total value, and a current state is further assessed using the assessed on-total value, at least in part. At least one predefined power threshold is then assessed based on the current state, and the power threshold is changed based, at least in part, on the at least one predefined power threshold. According to one embodiment, an adjust gain and phase value is assessed based, at least in part, on the current state, which is used to adjust a gain and phase value of the power amplifier.

Pursuant to various embodiments, an apparatus has also been provided that includes a plurality of amplifier banks, a controller circuit coupled to the amplifier banks that determines whether a counter value corresponds at least in a predetermined way to a counter threshold, and a switch circuit coupled to the amplifier banks and the controller circuit that switches a current status of one or more of the amplifier banks when the counter value corresponds at least in the predetermined way to the counter threshold. According to one embodiment, the controller circuit further assesses an amplifier bank that has been unchanged for a longest period of time to provide the at least one amplifier bank. In another embodiment, the controller circuit also assesses a total number of the multiple amplifier banks having a predefined current status in order to provide an assessed total value, which is used to assess a current state of the power amplifier. The current state is then used to assess an adjust gain and phase value to adjust a gain and phase value based on the adjust gain and phase value. The controller circuit further assesses a predefined power threshold based, at least in part, on the current state to change a power threshold.

Through these various teachings, a power management technique has been provided that, among other things, optimizes the power of the amplifier by dynamically matching traffic patterns and power out capability. As a result, current drain and cost of operation of the power amplifier have been reduced. The various embodiments also provide an on-demand approach to the power amplifier that is more autonomous than the prior art. Another advantage is that legacy customers can benefit using the various embodiments described, since they provide savings even on single carrier installations without multiple modules to switch the amplifier banks. Thus, as capacity increases in an operator's cell site, more and more attention is being given to the cost of operations, which is one of the most important goals in any general communications system.

For example, using the various embodiments provided, the forward link power amplifiers can account for 50% to 70% of the total power usage in the base station equipment. In a typical feed-forward amplifier scheme, the final stages can account for 60% to 80% of the total current draw. The on-demand architecture provided by various embodiments, in essence, allows the amplifier to turn off available power reserved for peak usage during busy hours, which translates to more efficient use of power that reduces the cost of operation. Moreover, the power management technique also properly rotates the amplifier bank to balance the wear and tear of the power amplifier to extend its service lifetime. Again, this is one of numerous ways that these various teachings can reduce the cost of operation while maintaining efficient power usage.

Figure 1:
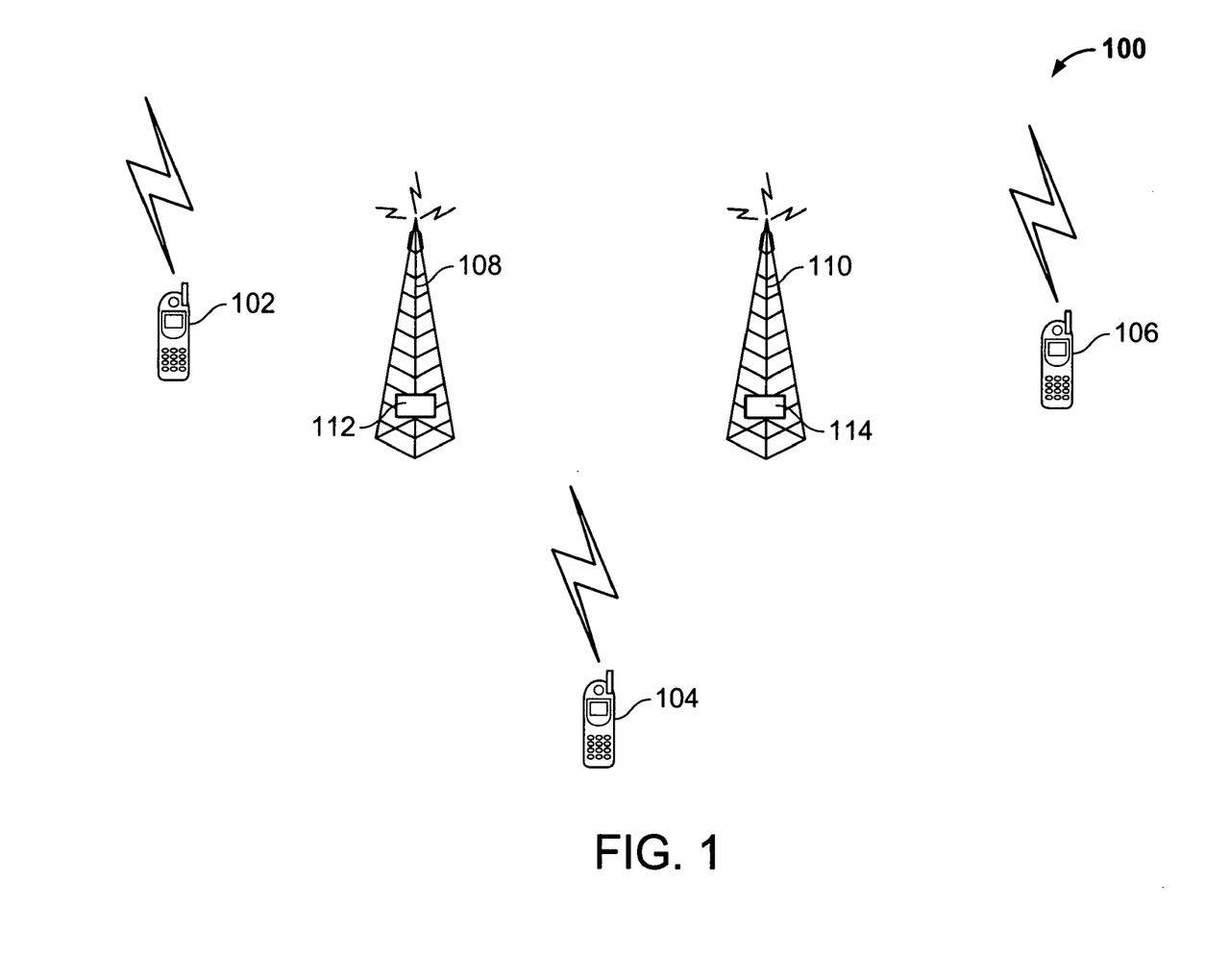
FIG. 1 comprises an illustration of an exemplary communications system in which various embodiments may be implemented.

Referring now to the drawings, and in particular to FIG. 1, for purposes of providing an illustrative but nonexhaustive example to facilitate this description, a communications system is shown and indicated generally at numeral reference 100. Those skilled in the art, however, will recognize and appreciate that the specifics of this illustrative example are not specifics of the invention itself and that the teachings set forth herein are applicable in a variety of alternative settings. For example, since the teachings described are not platform dependent, they can be applied to various systems, such as, but not limited to, Code Division Multiple Access (CDMA) systems, Time Division Multiple Access (TDMA) systems, Universal Mobile Telecommunications Systems (UMTSs), and General Packet Radio Service (GPRS) systems. In fact, any communication networks that transmit data between nodes through cell sites are contemplated and are within the scope of the invention.

Referring now to the exemplary communication network shown in FIG. 1, a plurality of mobile stations 102, 104, 106 (three shown) communicates with multiple base stations 108, 110 (two shown). Specifically, as is typically well known in the art, the mobile stations 102, 104, 106 communicate with one another using base stations 108, 110 that are located in their geographical area. Because every transmission via the base stations 108, 110 requires power usage, efficient use of the power can, at times, affect the quality of communications between the mobile stations 102, 104, 106. For example, portions of the amplifier banks should be turned off and/or decreased during off-peak hours to conserve energy. Conversely, during peak hours, power usage should be turned on and/or increased to accommodate the demands of the mobile stations. The efficient usage of these amplifier banks of the power amplifier can affect the quality of communications between the mobile stations, but, at the same time, increase the cost of operations if the power amplifier is unnecessarily switched while waiting for demands from the mobile stations.

To address some of these issues, on-demand power amplifiers 112, 114 implemented with the various embodiments are included at each of the base stations 108, 110, respectively. Of course, although FIG. 1 specifically shows an implementation at the base stations 108, 110, other components, such as a radio access network controller (not shown), may also be used. Since there are multiple ways to implement these various teachings described, the base stations 108, 110 will be used as one example. These other implementations are within the present scope of the various teachings, since they are readily appreciated by one skilled in the art. Moreover, since current cell phones have many similar functions to that of computer devices, a mobile station will be herein used to refer to any device that requires a power control system, which includes, but is not limited to, cell phones, personal digital assistants, and/or computers.

Figure 2:
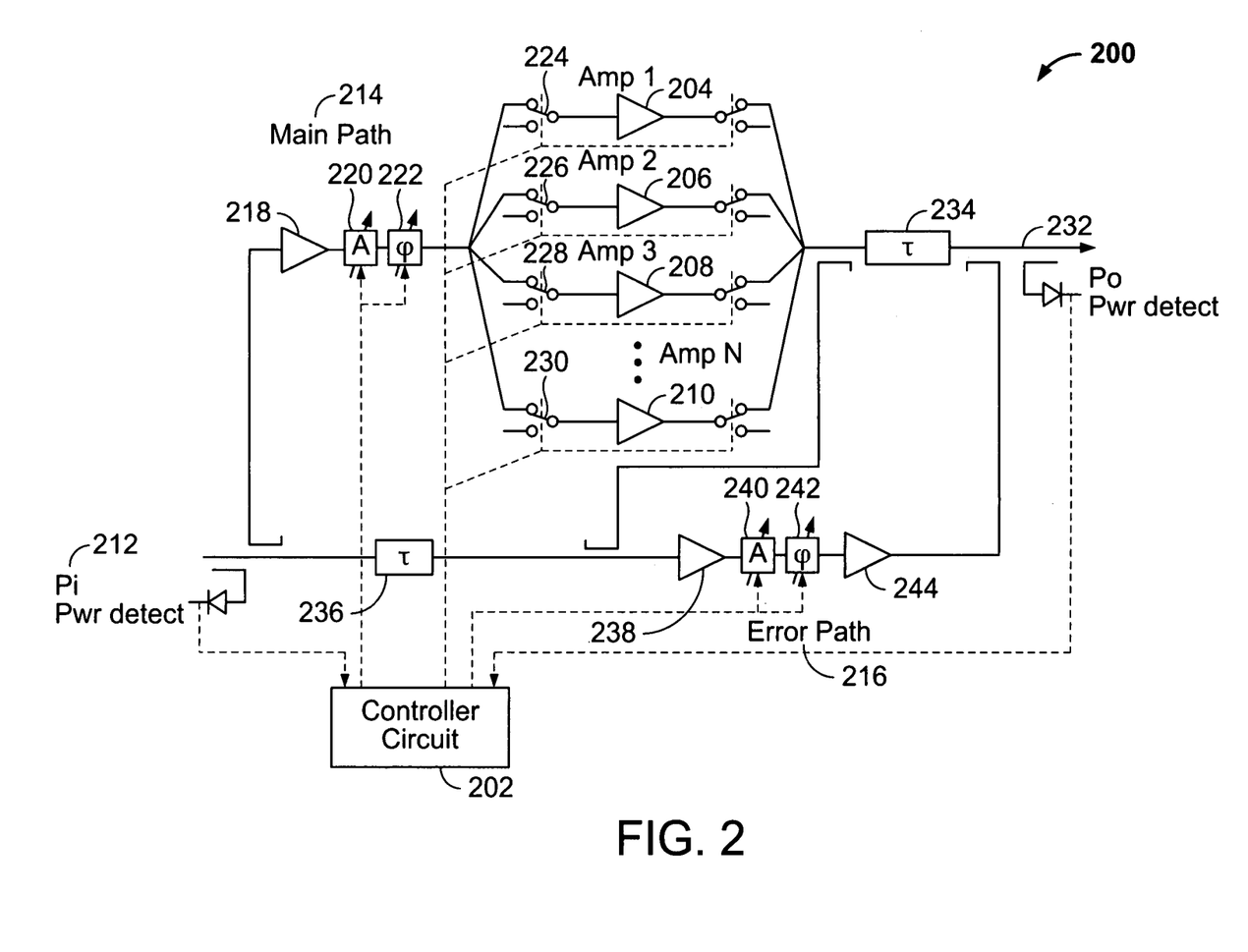
FIG. 2 comprises an illustration of an apparatus in which various embodiments may be implemented.

Turning now to FIG. 2, an apparatus according to one embodiment is shown and indicated generally at numeral reference 200. Specifically, a feed-forward power amplifier 200 has been shown as an example. Please note, however, the various teachings described contemplate implementation in other linear power amplifiers, such as a digital pre-distorted power amplifier and a negative feedback power amplifier. In fact, other non-linear power amplifiers, such as frequency modulation class C power amplifiers, are also contemplated. As such, it should be well understood that the various embodiments described are not limited to the specific exemplary feed-forward power amplifier apparatus 200, and other apparatus implementations are readily appreciated by a skilled artisan and are within the scope of the various embodiments. Moreover, "circuit" refers to one or more component devices such as, but not limited to, those component devices referred to herein, processors, memory devices, application specific integrated circuits (ASICs), and/or firmware, which are created to implement or adapted to implement (perhaps through the use of software) certain functionality, all within the scope of the various teachings described.

For this particular exemplary apparatus 200, a controller circuit 202 is included to control, among other things, a plurality of amplifier banks 1 through N, designated as numeral references 204, 206, 208, and 210. In particular, as typically done in a feed-forward power amplifier, power at an input side 212 goes to a main path 214 and an error path 216. At the main path 214, the power input 212 goes to a main low level gain 218 that adds a prefixed level of power to the power input, depending upon the system configuration of the communications system. The power input 212 then continues to a main gain adjuster 220 and a main phase adjuster 222 for a typical adjustment of the gain and phase value, which is controlled by the controller circuit 202. The power input 212 is then divided by switch circuits 224, 226, 228, 230 to the multiple amplifier banks 1 through N 204, 206, 208, 210. In this example, the controller circuit 202 controls multiple thresholds that affects the gain and phase adjustment and the division of the power input 212 into the multiple amplifier banks 1 through N 204, 206, 208, 210. Specifically, among other things, the controller circuit 202 switches a current status of each of the multiple amplifier banks 1 through N 204, 206, 208, 210 to produce a more efficient usage of the power amplifier by assessing multiple considerations, such as current traffic and demands in the system. After the needed adjustments, a power output 232 based on added outputs of the multiple amplifier banks 1 through N 204, 206, 208, 210 and a delay adjustment by a main delay element 234 that delays the feed of the power output for synchronization with the error path 216.

At the error path 216, the power input 212 is similarly forwarded to an error delay element 236 that synchronizes the timing of the output feed with the main path 214. After a predefined delay, the power input 212 is forwarded to an error low level gain 238 that amplifies the distortion of the power input, which is then forwarded to an error gain adjuster 240 and an error phase adjuster 242 for adjusting a gain and phase value controlled by the controller circuit 202. After these adjustments of the gain and phase value are made, the power input is output to a final level gain 244 that output an error output to be combined with the power output 232. As shown, a general flow of the power input 212 and the power output 232 has been described. Because the controller circuit 202 provides multiple controls within the various routes of the general flow, it can provide a more efficient power amplifier, since the controller circuit takes an on-demand approach having a more holistic view of the system and demands on the system. As a result, an apparatus has been provided that reduces the cost of operation by reducing unneeded power usage, while at the time maintaining efficient usage of the power to provide quality service to the mobile stations.

Figure 3:
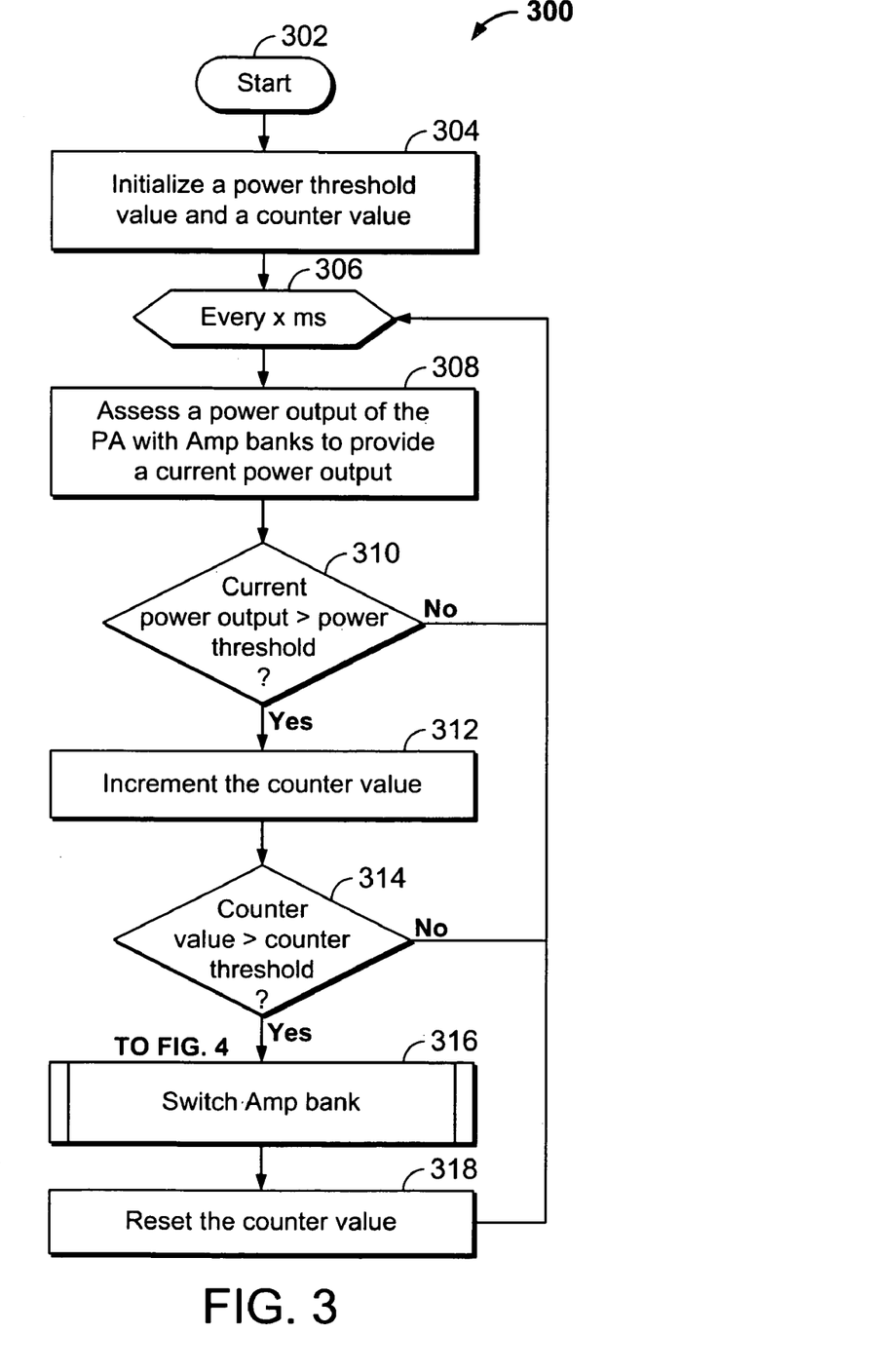
FIG. 3 comprises a flow chart of a power management process according to various embodiments.

Turning now to FIG. 3, a flow chart of a power management process according to an embodiment is shown and indicated generally at numeral reference 300. Although the process shown is preferably implemented at the base stations 108, 110, there may be other implementations of each of the processes shown that are better suited for a radio access network controller (not shown) and/or the mobile stations 102, 104, 106 in the communication system. These processes shown, thus, can be implemented fully or partially at any of the components within the system. Moreover, as one skilled in the art can readily appreciate, any of the processes shown can be altered in multiple ways to achieve the same functions and results of the various teachings described. As a result, these processes shown are one exemplary embodiment of multiple variation embodiments that may not be specifically shown. Thus, the processes shown are directed to the system, and each of them may be altered slightly to accommodate any of the components in the communications system. Moreover, for the sake of brevity, "power output" is used as an example, but any monitored power, which includes but is not limited to input, output, or any other source of power, is contemplated. Thus, it should be understood that power output used in the remaining description of application includes any type of monitored power. These other embodiments, however, are within the scope of the various teachings described.

Figure 4:
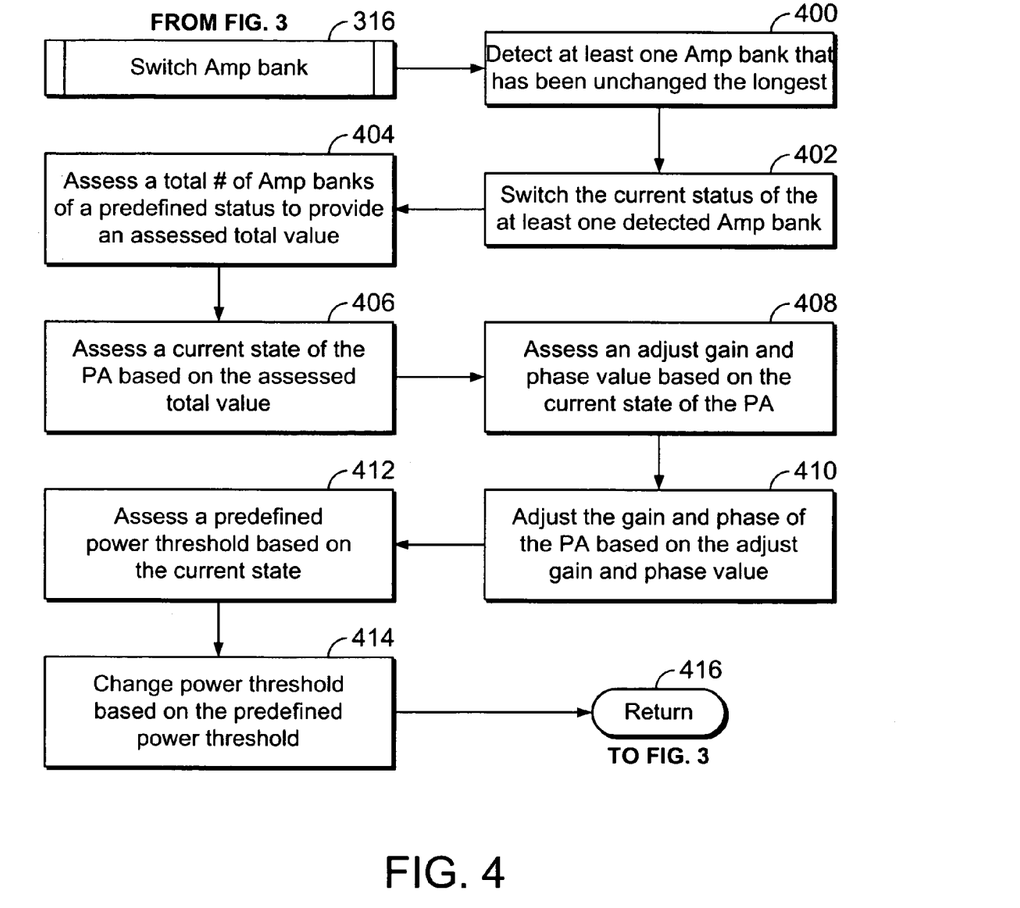
FIG. 4 comprises a flow chart of a switch process shown in FIG. 3 according to various embodiments.

The particular process 300 shown starts 302 with an initialization 304 of a power threshold value and a counter value. For every predefined "x" milliseconds 306, a power output of a power amplifier having multiple banks is assessed 308 to provide a current power output of the power amplifier, which is compared to determine 310 whether it corresponds in at least a predetermined way (e.g., greater than in this example shown) to the power threshold. If not, the process 300 loops back and waits for every x milliseconds 306 to reassess the power output of the power amplifier. If, on the other hand, the current power output does correspond in at least the predetermined way (e.g., is greater than) to the power threshold, the counter value is incremented 312 and another comparison is made. Specifically, the counter value, after being incremented 312, is compared to determine 314 whether it corresponds in at least a predetermined way (e.g., greater than) to a counter threshold. If not, the process 300 is again looped back to wait for every x milliseconds 306. Otherwise, if the counter value is greater than the counter threshold, another switch subroutine 316 for switching the amplifier bank is executed, which is shown in FIG. 4. After the subroutine 316 is processed, the counter value will be then reset and the process loops back to wait for every x milliseconds 306.

Turning now to FIG. 4, a flow chart of a switch process 316, which is also the switch subroutine from FIG. 3, is shown according to one embodiment. The switch process 316 starts with detection 400 of at least one amplifier bank that has been unchanged for the longest period of time to provide at least one detected amplifier bank, which is switched 402 to change a current status of the detected amplifier bank. For example, if the detected amplifier bank is switched on, the detected amplifier bank is then switched off, and vice versa. Next, a total number of amplifier banks of a predefined status is assessed 404 to provide an assessed total value. In other words, the process 316 either assesses a total number of amplifier banks that may be currently on or off in order to obtain the assessed total value, and using this value, a current state of the power amplifier is assessed 406. Thereafter, an adjust gain and phase value based on the current state of the power amplifier is assessed 408 and used to adjust 410 the gain and phase of the power amplifier.

Once the gain and phase of the power amplifier has been adjusted 410, a predefined power threshold is assessed 412 based on the current state and change 414 the power threshold of the power amplifier, and the process ends or returns 416 to FIG. 3. It should be noted, however, that these predefined power thresholds can be static thresholds stored in a list and/or can be dynamic thresholds that are adjusted with one or more iterations. Moreover, the predefined power threshold can include a single threshold for the power amplifier for each current state and/or for an amplifier bank for each current state. As readily appreciated by one skilled in the art, there are countless ways to implement the predefined thresholds for the power amplifier, and as such, these variations of the predefined power threshold, which may include one or a plurality of thresholds for one or more states of the power amplifier, are within the scope of the various teachings provided.

Figure 5:
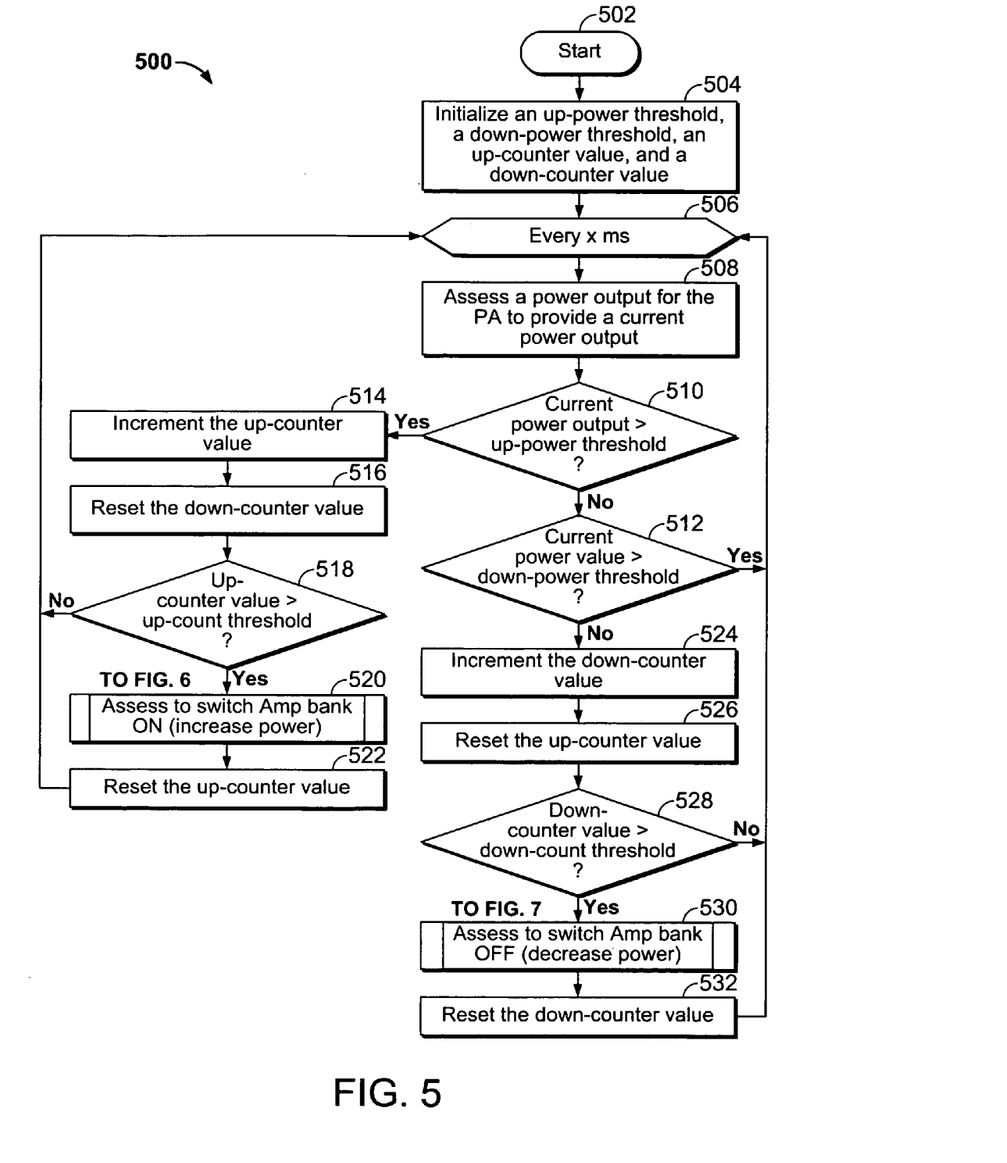
FIG. 5 comprises a flow chart of a power management process implemented with static predefined thresholds of the power amplifier according to various embodiments.

Referring now to FIG. 5, a flow chart of a power management process implemented with static predefined threshold of the power amplifier according to an embodiment is shown and indicated generally at 500. The power management process 500, as shown, starts 502 with an initialization 504 of an up-power threshold, a down-power threshold, an up-counter value, and a down-counter value. After numerous values have been initialized 504, for every x millisecond 506, a power output of the power amplifier is assessed 508 to provide a current power output. This current power output is compared to determine 510 whether it corresponds in at least a predetermined way (e.g., greater than in the embodiment) to the up-power threshold to check if the power amplifier should be increased. If not, the current power value is compared to determine 512 whether it is greater than the down-power threshold to check if the power amplifier should be decreased, instead. This is specifically done to determine whether the power amplifier should be changed or simply looped back to wait for every x millisecond 506 if no action is needed to adjust the power amplifier.

Figure 6:
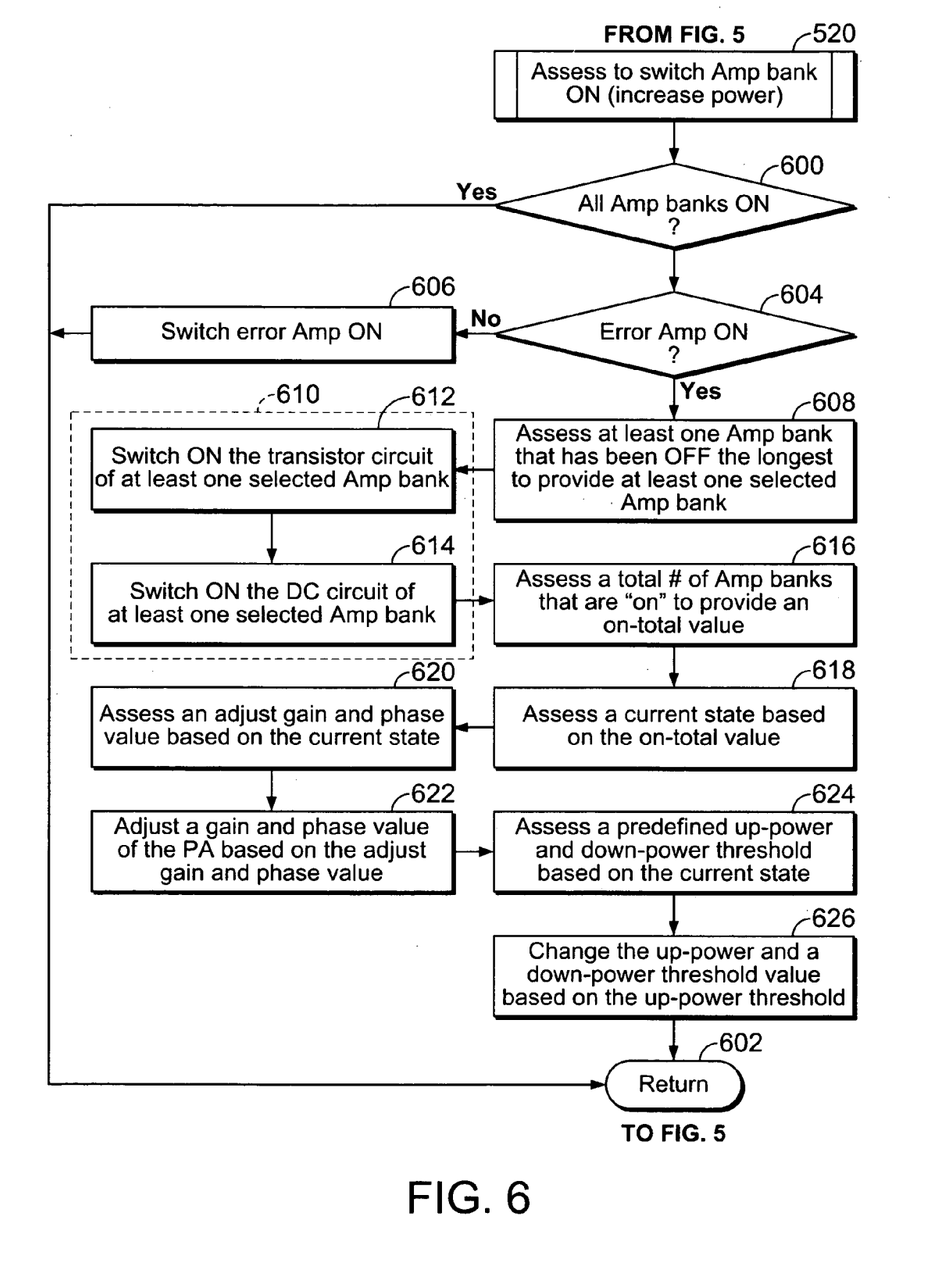
FIG. 6 comprises a flow chart of a switch-on process from FIG. 5 according to various embodiments.

If the current power output does correspond in at least the predetermined way to (e.g., is greater than) the up-power threshold, the up-counter value is incremented 514 and the down-counter is reset 516 to prepare for power adjustment of the amplifier. The up-counter value is compared with an up-count threshold to determine 518 whether they correspond to one another in at least a predetermined way, such as whether the up-count threshold is greater than the up-count threshold. If not, no change in the power usage of the power amplifier will be effectuated, and the process 500 loops back to wait for every x millisecond to run another iteration. If, on the other hand, the up-counter value is greater than the up-count threshold, a subroutine 520 assessment to switch on an amplifier bank is triggered, which is shown in FIG. 6. After this subroutine 520 has been processed, the up-counter is reset 522 again and the process 500 loops back to wait for every x millisecond 506 to rerun the process from that point.

Figure 7:
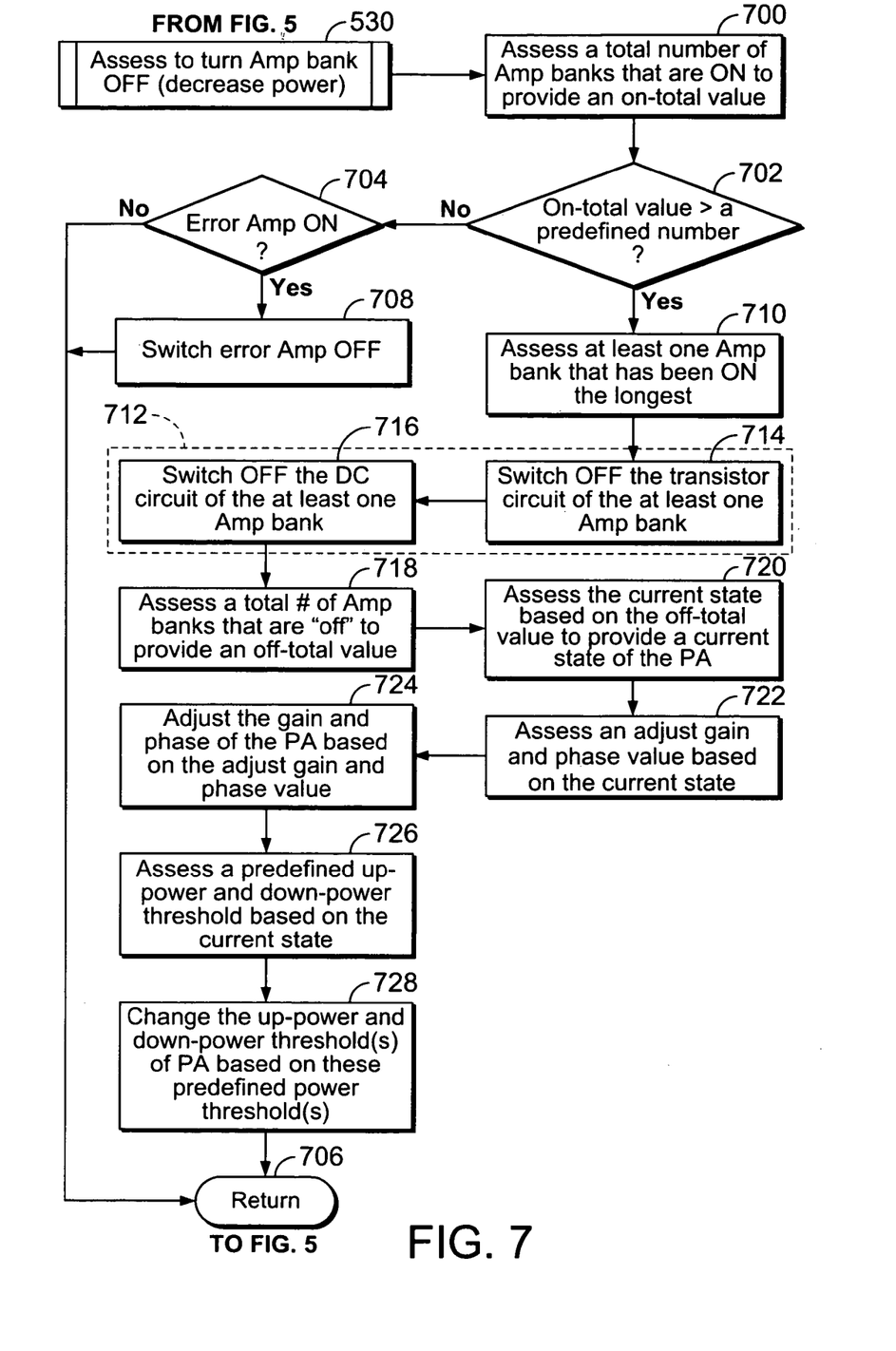
FIG. 7 comprises a flow chart of a switch-off process from FIG. 5 according to various embodiments.

If the power amplifier should be decreased, meaning that the current power value is not greater than the down-power threshold 512, the down-counter value is incremented 524 and the up-counter is reset 526 to again prepare the power amplifier for an adjustment of a decrease in power output. After this increment of the down counter value, it is compared to determine 528 whether it corresponds in a predetermined way to (e.g., greater than) a down-counter threshold. If not, the process 500 does not prepare to change the power usage of the power amplifier, and instead loops back and waits to rerun the iteration again after x milliseconds 506. If, however, the down-counter value corresponds in the predetermined way to (e.g., is greater than) the down-counter threshold, a subroutine 530 assessment to switch off an amplifier bank shown in FIG. 7 is triggered. After this subroutine 530 has been processed, the up-counter is similarly reset 532 again and the process 500 loops back to wait for every x milliseconds 506 to rerun the process from that point.

Turning now to FIG. 6, a flow chart of a switch-on process, according to an embodiment, from FIG. 5 is shown. The switch-on process 520 starts by making sure that not all amplifier banks are already on. Specifically, the process 520 determines 600 whether all amplifier banks in the power amplifier are already switched on, and if so, the process 520 ends and returns 602 to FIG. 5. If, however, not all the amplifier banks are switched on, which means that at least one amplifier bank can be switched on to increase the power, it is next determined 604 whether an error amplifier has been switched on. If not, the error amplifier is switched 606 on and the switch-on process ends and returns 602 to FIG. 5. The error amplifier, as is well known in the art, should be switched on to accommodate any distortion that must to be amplified. If, on the other hand, the error amplifier is already switched on, at least one amplifier bank that has been off for a longest period of time is assessed 608 to provide at least one selected amplifier bank to be switched on 610, specifically the transistor circuit and the direct current circuit of the selected amplifier bank is switched on 612, 614.

After the selected amplifier bank is switched on, a total number of amplifier banks that have been switched on is assessed 616 to provide an assessed on-total value, which is used to assess 618 a current state of the power amplifier. An adjust gain and phase value is then assessed 620 based, at least in part, on this current state and a gain and phase value of the power amplifier is, in turn, adjusted 622 based, at least in part, on this adjust gain and phase value. A predefined up-power and down-power threshold is also assessed 624 based, at least in part, on the current state, and the up-power and down-power threshold is changed based, at least in part, on these predefined threshold values. The process 520 ends and returns to FIG. 5 at this point.

Turning now to FIG. 7, a flow chart of a switch-off process from FIG. 5 is shown according to an embodiment. The switch-off process 530 starts with an assessment 700 of a total number of amplifier banks that are switched on to provide an on-total value, which is compared to determine 702 whether it corresponds in a predetermined way to (e.g., greater than) a predefined number. This comparison to the predefined number is included to make sure that the power amplifier is never completely off. In other words, to ensure the power amplifier is up and ready for any power adjustment, at least one amplifier bank should be switched on to keep the power amplifier active and ready, and this predefined number depends upon the power demands of the communications system. Referring back to FIG. 7, if the on-total value is not greater than the predefined number, it is next determined 704 whether an error amplifier has been switched on. If the error amplifier is not switched on, meaning it is switched off, the process 530 ends and returns 706 to FIG. 5. If, on the other hand, the error amplifier is switched on, the process 530 switches 708 the error amplifier off and loops to end 706 the process and return to FIG. 5.

If, however, the on-total value is greater than the predefined number, at least one amplifier bank that has been switched on for a longest period of time is assessed 710 and switched 712 off. Specifically, the transistor circuit and the direct current circuit of the amplifier bank are switched off 714, 716. After at least one amplifier has been switched 712 off, a total number of amplifier banks that are off is assessed 718 to provide an off-total value, which is used to assess 720 a current state of the power amplifier. An adjust gain and phase value is again assessed 722 based, at least in part, on the current state, and a gain and phase value of the power amplifier is accordingly adjusted 724 based on this adjust gain and phase value. Moreover, using the current state of the power amplifier, a predefined up-power threshold and a down-power threshold are assessed 726 based, at least in part, on the current state. The up-power and down-power thresholds are accordingly changed 728 based on these predefined assessed thresholds, which brings the process 530 to an end 706 to return to FIG. 5.

Figure 8:
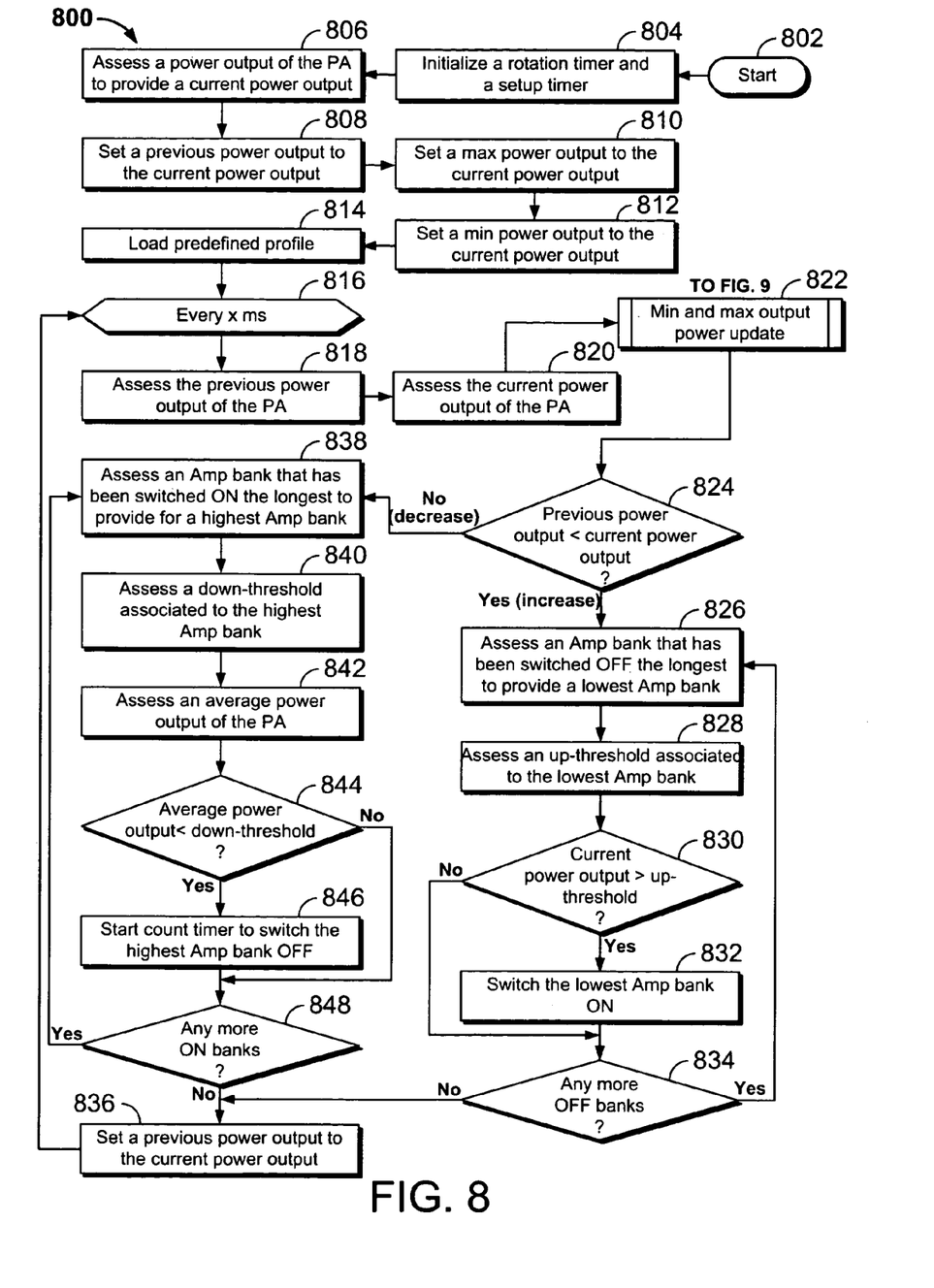
FIG. 8 comprises a flow chart of a power management process implemented with dynamic predefined thresholds of the amplifier banks according to various embodiments.

Referring now to FIG. 8, a flow chart of a power management process implemented with dynamic predefined thresholds of the amplifier banks according to an embodiment is shown and indicated generally at numeral reference 800. The power management process 800 starts 802 with an initialization 804 of a rotation timer and a setup timer, followed by an assessment 806 of a power output of the power amplifier to provide a current power output. A previous power output is set 808 to the current power output, and a maximum power output and a minimum power output is also set 810, 812 to this current power output. A predefined profile is also loaded 814, which finalizes the initialization of the process 800. For every x milliseconds 816, another subroutine starts with an assessment of the previous power output 818 and the current power output 820 of the power amplifier. A min/max output power update subroutine process 822 is next executed to update the maximum power output and the minimum power output. The min/max output power update subroutine process 822 will be described later in FIG. 9. After the minimum and maximum power output has been updated via the process 822, it is determined 824 whether a previous power output corresponds in at least a predetermined way to (e.g., is greater than) the current power output, and if so, the process 800 will decrease the power outputted by power amplifier. If, otherwise, the previous power output does not correspond to (e.g., is not greater than) the current power output, the process 800 increases the power outputted by power amplifier.

Turning first to the subroutine to increase the power amplifier, an amplifier bank that has been switched off the longest period of time is assessed 826 to provide a lowest amplifier bank. An up-threshold associated with the lowest amplifier bank is assessed 828 to determine 830 whether the current power output corresponds in at least a predetermined way to (and specifically whether it is greater than in this embodiment shown) the up-threshold. If, in fact, the current power output is greater than the up-threshold, the lowest amplifier is switched 832 on to output more power, or otherwise, the subroutine ends without switching on the lowest amplifier bank. The process 800 next determines whether there any more amplifier banks that may be off, and if so, loops back to rerun the subroutine from the assessment 826 of a next lowest amplifier bank until all the amplifier banks that are off have been accounted for. If, on the other hand, there are not any more amplifier banks that are switched off, the process 800 continues and sets 836 the previous power output to the current power output to rerun the iteration every x milliseconds 816.

Turning next to the subroutine for decreasing the power of the power amplifier, an amplifier bank that has been switched on the longest is assessed 838 to provide a highest amplifier bank. In this case, a down-threshold associated with the highest amplifier bank is assessed 840, followed by an average power output of the power amplifier being assessed 842. It is then determined 844 whether the average power output corresponds in at least a predetermined way to (e.g., less than in this embodiment shown) the down-threshold, and if so, the count timer associated with this highest amplifier bank is started 846 to count down a time period to switch off the highest amplifier bank. This part of the subroutine is again finished for a particular amplifier bank, and the process 800 continues to determine 848 whether there are any more amplifier banks that may be switched on so that they can be switched off to reduce the power of the power amplifier. If there are, in fact, more amplifier banks that may be switched off, the process 800 continues to loop back from the assessment 838 of a next highest amplifier bank. This part of the process 800 is executed until the amplifier banks that are switched off have been accounted for. Again, the process 800 continues and sets 836 the previous power output to the current power output to wait for every x milliseconds 816 to rerun the iteration.

Figure 9:
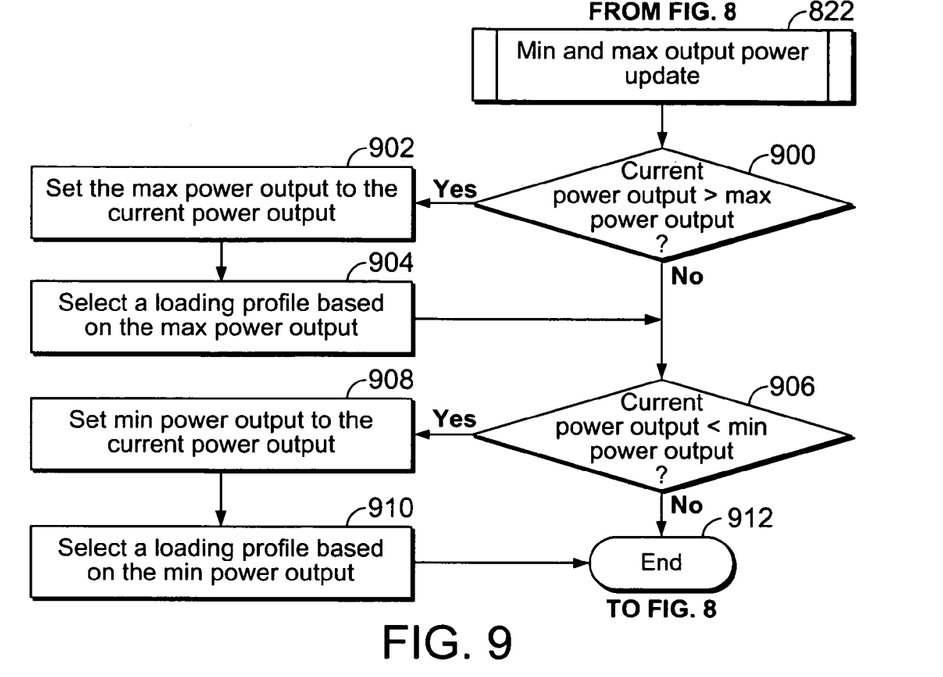
FIG. 9 comprises a flow chart of a min/max output power update process from FIG. 8 according to various embodiments.

Referring now to FIG. 9, a flow chart of a min/max output power update process 822 from FIG. 8 is shown according to one embodiment. The process 822 starts with a comparison to determine 900 whether the current output corresponds in at least a predetermined way to (in this case whether it is greater than) the maximum power output, and if so, the maximum power output is set 902 to the current power output and a loading profile that is based on the maximum power output is loaded 904. If, however, the current power output is not greater than the maximum power output 900 and/or after the new loading profile has been loaded 904, the current power is then compared to determine 906 whether it corresponds in at least a predetermined way to (e.g., less than in this embodiment shown) the minimum power output. Again, if this is the case, the minimum power output is updated by being set 908 to the current power output, and accordingly, a loading profile based on this new minimum power output is loaded 910. Either when the current power output is not less than the minimum power output 906 and/or after the new loading profile is loaded based on an updated minimum output, the process 822 ends 910 and returns to FIG. 8.

Figure 10:
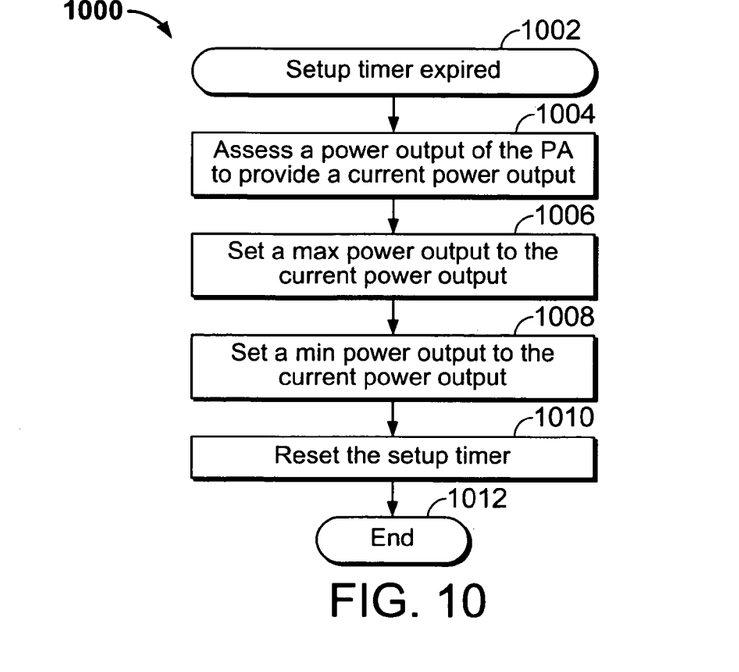
FIG. 10 comprises a flow chart of a setup timer expiration process according to various embodiments.

Turning now to FIG. 10, a flow chart of a setup timer expiration process according to an embodiment is shown and indicated generally at numeral reference 1000. This process 1000 is triggered 1002 with an expiration of the setup timer. A power output of the power amplifier is assessed 1004 to provide a current power output. The maximum power output and the minimum power output are set 1006, 1008 to this current power output, followed by the setup timer being reset 1010, which ends 1012 the process 1000.

Figure 11:
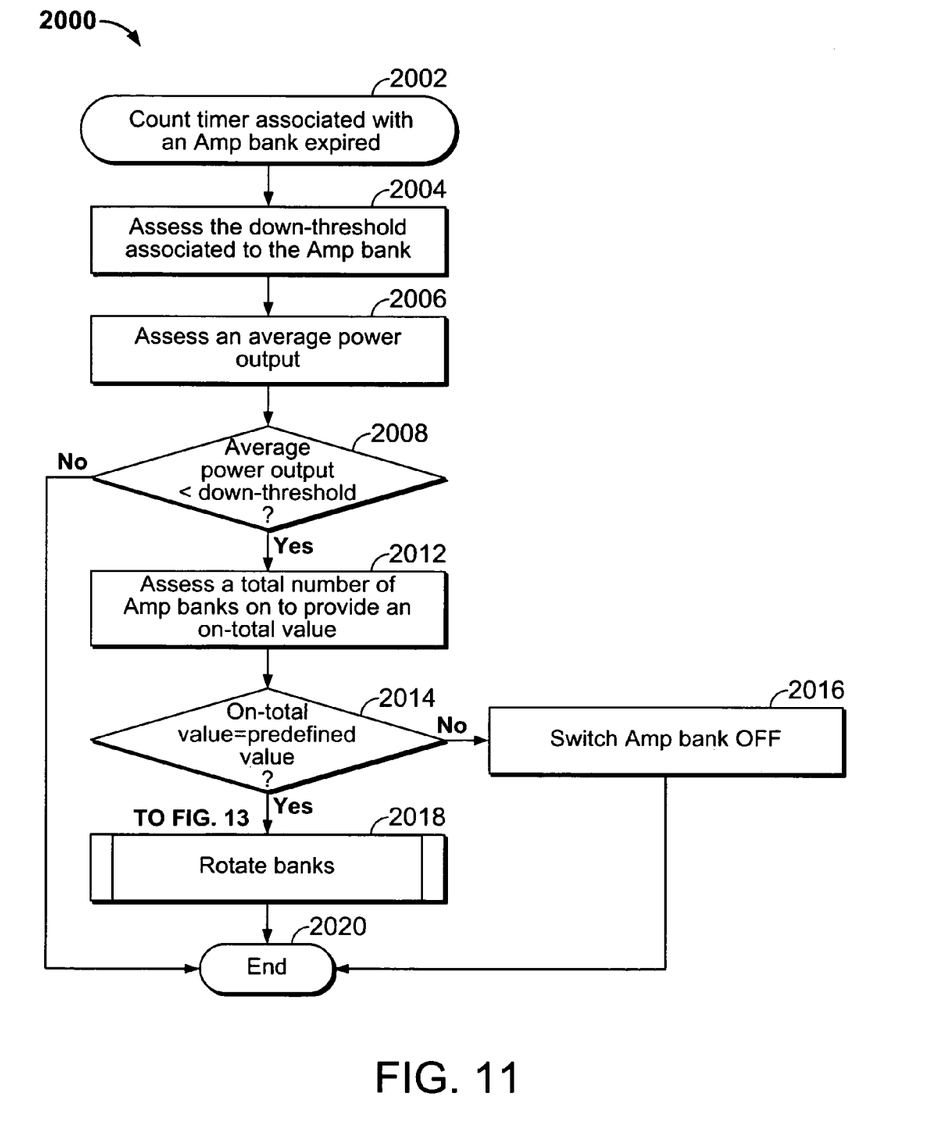
FIG. 11 comprises a flow chart of a count timer expiration process according to various embodiments.

Referring now to FIG. 11, a flow chart of a count timer expiration process according to an embodiment is shown and indicated generally at 2000. Recall from FIG. 8 that a count timer is started before a particular amplifier bank can be switched off. According to this embodiment, a multiple count timer associated with different amplifier banks may be started to wait for the timing to be switched off. This process 2000 describes an expiration of a count timer 2002 that is associated with a particular amplifier bank waiting to be switched off. At which time, a down-threshold associated with this particular amplifier bank and an average power output of the power amplifier are assessed 2004, 2006. Using these assessed values, a comparison is done to determine 2008 whether the average power output corresponds in at least a predetermined way to (e.g., less than in this embodiment shown) the down-threshold, and if not, the process 2000 ends 2020 until a next count timer expires. If, however, the average power output is less than the down-threshold, a total number of amplifier banks that are switched on is assessed 2012 to provide an on-total value, which is used to determine 2014 whether the on-total value corresponds in at least a predetermined way to (and specifically whether it is equal to in this embodiment shown) a predefined value. If not, the amplifier bank associated with the expired count timer is switched 2016 off and the process 2000 ends 2020 at this point. If, on the other hand, the on-total value is equal to the predefined value, a rotate banks process 2018 shown in FIG. 13 is triggered, which brings the process 2000 to an end.

Figure 12:
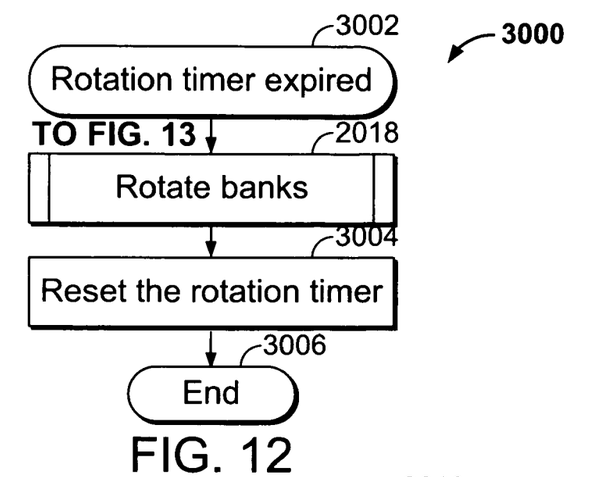
FIG. 12 comprises a flow chart of a rotation timer expiration process according to various embodiments.

Turning now to FIG. 12, aside from the count timer expiration process, the rotate banks process 2018 can also be triggered with an expiration of the rotation timer, which will be referred to as the rotation timer expiration process and indicated generally at numeral reference 3000. As stated, this process 3000 is triggered with the expiration 3002 of the rotation timer. The rotate banks process 2018 shown in FIG. 13 is then initiated in response, and the rotation timer is accordingly reset 3004 after the rotate banks process has been processed, which brings the process 3000 to an end 3006. Note that the rotate banks process 2018 can be executed from multiple routes.

Figure 13:
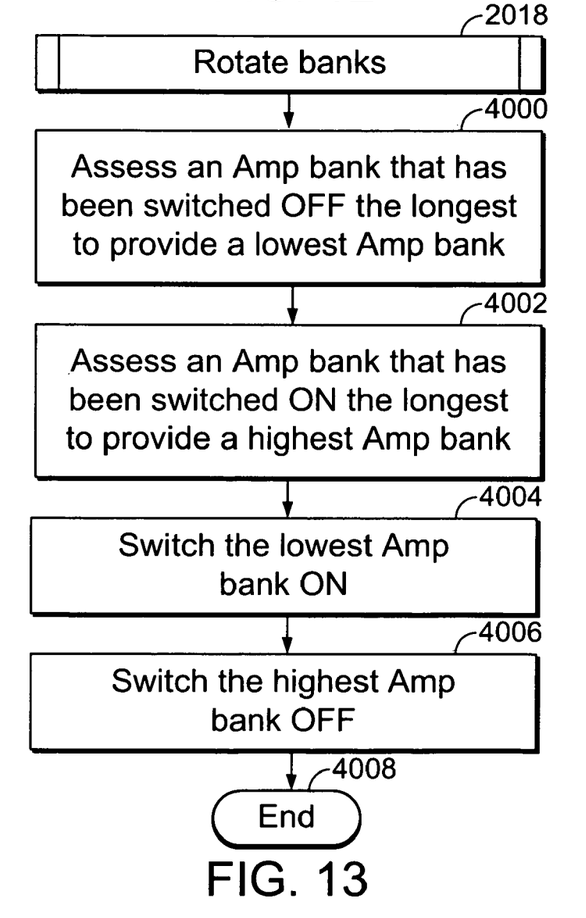
FIG. 13 comprises a flow chart of a rotate banks process according to various embodiments.

Referring now to the rotate banks process 2018 shown in FIG. 13, an amplifier bank that has been switched off for a longest period of time is assessed 4000 to provide a lowest amplifier bank. A highest amplifier bank is also provided through another assessment 4002 of an amplifier bank that has been switched on for a longest period of time. To rotate the amplifier banks in order to increase their lifetime expectancy, the lowest amplifier bank is switched 4004 on and the highest amplifier bank is switched 4006 off, and the process 2018 ends 4008 at this point.

With these various teachings shown, a power management technique has been provided that, among other things, optimizes the power of the amplifier by dynamically matching traffic patterns and power out capability. This optimization, as a result, reduces the current drain and the cost of operation of power amplifier. An on-demand approach of the power amplifier has been provided that is more autonomous. The various embodiments can be more easily implemented with legacy customers that can take advantage of savings of costs of operation even for single carrier installations without multiple modules for switching the amplifier banks. Thus, as capacity increases in an operator's cell site, more and more attention is being given to cost of operations, which is one of the most important goals in any general communications system.

For example, using the various embodiments provided, the forward link power amplifiers can account for 50% to 70% of the total power usage in the base station equipment. In a typical feed-forward amplifier scheme, the final stages can account for 60% to 80% of the total current draw. The on-demand architecture provided by various embodiments, in essence, allows the amplifier to turn off available power reserved for peak usage during, for example, busy hours, which translates to more efficient use of power that reduces the cost of operation. Moreover, the power management technique also properly rotates the amplifier bank to balance the wear and tear of the power amplifier to extend its service lifetime. Again, this is one of numerous ways that the various teachings can reduce the cost of operation, while maintaining efficient power usage.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A method comprising:
   determining whether a counter value corresponds at least in a predetermined way to a counter threshold;
   switching a current status of at least one amplifier bank from a plurality of amplifier banks in a power amplifier when the counter value corresponds at least in the predetermined way to the counter threshold.

2. The method according to claim 1 further comprising:
   waiting for a predefined period of time to repeat the method when the counter value corresponds at least in the predetermined way to the counter threshold.

3. The method according to claim 1 further comprising, prior to determining whether the counter value corresponds at least in the predetermined way to the counter threshold:
   assessing a power output of the power amplifier to provide a current power output;
   determining whether the current power output corresponds at least in a predetermined way to a power threshold;
   waiting for a predefined period of time to repeat the method when the current power output does not correspond at least in the predetermined way to the power threshold.

4. The method according to claim 1 further comprising:
   incrementing the counter value prior to determining whether the counter value corresponds at least in the predetermined way to the counter threshold;
   resetting the counter value when the counter value corresponds at least in the predetermined way to the counter threshold.

5. The method according to claim 1 further comprising, prior to switching the current status of the at least one amplifier bank from the plurality of amplifier banks:
   assessing an amplifier bank from the plurality of amplifier banks that has been unchanged for a longest period of time to provide the at least one amplifier bank.

6. The method according to claim 1 further comprising:
   assessing a total number of the plurality of amplifier banks having a predefined current status to provide an assessed total value;
   assessing a current state of the power amplifier based, at least in part, on the assessed total value.

7. The method according to claim 6 further comprising:
assessing an adjust gain and phase value based, at least in part, on the current state;
adjusting a gain and phase value of the power amplifier based, at least in part, on the adjust gain and phase value.

8. The method according to claim 6 further comprising:
assessing a predefined power threshold based, at least in part, on the current state;
changing a power threshold based, at least in part, on the predefined power threshold.

9. The method according to claim 1, wherein the method is repeated after a predefined time duration.

10. A method comprising:
assessing a power output of a power amplifier having a plurality of amplifier banks to provide a current power output;
determining whether the current power output corresponds at least in a first predetermined way to a power threshold;
determining whether an up-counter value corresponds at least in a second predetermined way to an up-count threshold for switching on at least one amplifier bank from the plurality of amplifier banks when the current power output corresponds at least in the first predetermined way to the power threshold;
determining whether a down-counter value corresponds at least in a third predetermined way to a down-count threshold for switching off at least one amplifier bank from the plurality of amplifier banks when the current power output does not correspond at least in the first predetermined way to the power threshold.

11. The method according to claim 10, wherein determining whether the current power output corresponds at least in the first predetermined way to the power threshold further comprises:
determining whether the current power output corresponds at least in a fourth predetermined way to an up-power threshold for switching on the at least one amplifier bank from the plurality of amplifier banks;
determining whether the current power output corresponds at least in a fifth predetermined way to a down-power threshold for switching off the at least one amplifier bank from the plurality of amplifier banks.

12. The method according to claim 10, wherein determining whether the up-counter value corresponds at least in the second predetermined way to the up-count threshold for switching on the at least one amplifier bank from the plurality of amplifier banks further comprises:
assessing at least one amplifier bank from the plurality of amplifier banks that has been off for a longest period of time to provide at least one assessed amplifier bank;
switching on the at least one assessed amplifier bank.

13. The method according to claim 10, wherein determining whether the down-counter value corresponds at least in the third predetermined way to the down-count threshold for switching off the at least one amplifier bank from the plurality of amplifier banks further comprises:
assessing at least one amplifier bank from the plurality of amplifier banks that has been on for a longest period of time to provide at least one assessed amplifier bank;
switching off the at least one assessed amplifier bank.

14. The method according to claim 10 further comprising:
assessing a total number of amplifier banks that are on to provide an assessed on-total value;
assessing a current state based, at least in part, on the assessed on-total value;
assessing at least one predefined power threshold based, at least in part, on the current state;
changing the power threshold based, at least in part, on the at least one predefined power threshold.

15. The method according to claim 14 further comprising:
assessing an adjust gain and phase value based, at least in part, on the current state;
adjusting a gain and phase value of the power amplifier based, at least in part, on the adjust gain and phase value.

16. An apparatus comprising:
a plurality of amplifier banks of a power amplifier;
a controller circuit coupled to the plurality of amplifier banks, wherein the controller circuit determines whether a counter value corresponds at least in a predetermined way to a counter threshold;
a switch circuit coupled to the plurality of amplifier banks and to the controller circuit, wherein the switch circuit switches a current status of at least one amplifier bank from the plurality of amplifier banks when the counter value corresponds at least in the predetermined way to the counter threshold.

17. The apparatus according to claim 16, wherein the controller circuit further assesses an amplifier bank from the plurality of amplifier banks that has been unchanged for a longest period of time to provide the at least one amplifier bank.

18. The apparatus according to claim 16, wherein the controller circuit further assesses a total number of the plurality of amplifier banks having a predefined current status to provide an assessed total value and a current state of the power amplifier based, at least in part, on the assessed total value.

19. The apparatus according to claim 18, wherein the controller circuit further assesses an adjust gain and phase value based, at least in part, on the current state and adjusts a gain and phase value of the power amplifier based, at least in part, on the adjust gain and phase value.

20. The apparatus according to claim 18, wherein the controller circuit further assesses a predefined power threshold based, at least in part, on the current state and changes a power threshold based, at least in part, on the predefined power threshold.

* * * * *